US010021228B2

United States Patent
Ageishi

(10) Patent No.: US 10,021,228 B2
(45) Date of Patent: Jul. 10, 2018

(54) CRADLE WITH PRIVACY PROTECTION FUNCTION FOR PORTABLE ELECTRONIC DEVICE

(71) Applicant: HIKARI HAJIME LLC, Tokyo (JP)

(72) Inventor: Koichi Ageishi, Tokyo (JP)

(73) Assignee: Hikari Hajime LLC, Tokyo (JP)

( * ) Notice: Subject to any disclaimer, the term of this patent is extended or adjusted under 35 U.S.C. 154(b) by 0 days.

(21) Appl. No.: 15/501,183

(22) PCT Filed: Jul. 31, 2015

(86) PCT No.: PCT/JP2015/072437
§ 371 (c)(1),
(2) Date: Feb. 2, 2017

(87) PCT Pub. No.: WO2016/024532
PCT Pub. Date: Feb. 18, 2016

(65) Prior Publication Data
US 2017/0230490 A1  Aug. 10, 2017

(30) Foreign Application Priority Data
Aug. 14, 2014 (JP) .................................. 2014-165114

(51) Int. Cl.
*H04B 1/38* (2015.01)
*H04M 1/00* (2006.01)
(Continued)

(52) U.S. Cl.
CPC .............. *H04M 1/04* (2013.01); *A45C 11/00* (2013.01); *A45F 5/00* (2013.01); *G03B 11/041* (2013.01);
(Continued)

(58) Field of Classification Search
CPC .. H04M 1/022; H04M 1/0262; H04M 1/0264; H04M 1/0283; H04M 1/04;
(Continued)

(56) References Cited

U.S. PATENT DOCUMENTS 7,667,433 B1* 2/2010 Smith ................... H01M 10/46 320/115
8,724,020 B1* 5/2014 Haddad ................ H04N 5/2254 348/375

(Continued)

FOREIGN PATENT DOCUMENTS

| JP | 2004235964 A | 8/2004 |
| JP | 2004235965 A | 8/2004 |

(Continued)

OTHER PUBLICATIONS

International Search Report for corresponding application PCT/JP2015/072437, dated Sep. 29, 2015.

*Primary Examiner* — Yuwen Pan
*Assistant Examiner* — Paul P Tran
(74) *Attorney, Agent, or Firm* — Renner, Otto, Boisselle & Sklar, LLP

(57) ABSTRACT

A front on an extension line of a built-in front camera lens part of said portable electronic device during use of the cradle is shielded by an opaque or translucent lens shielding member provided on the front face side of the cradle 3 for portable electronic devices of the present invention, thereby disabling photography of front surrounding conditions of the cradle, even if an operation of front camera unwanted by an owner is performed, and a microphone hole of the electronic device 11 is shielded by providing a microphone hole shielding member 13 in a space between the charging stand 4 and a housing of the electronic device 11 mounted thereon, and therefore it becomes possible to reduce a risk of an (Continued)

outflow of ambient voice information of the cradle, even if an operation of microphone unwanted by an owner is performed.

4 Claims, 5 Drawing Sheets

(51) Int. Cl.
| | |
|---|---|
| *H02J 7/00* | (2006.01) |
| *H04N 5/225* | (2006.01) |
| *H01G 4/02* | (2006.01) |
| *H05K 7/00* | (2006.01) |
| *G03B 17/00* | (2006.01) |
| *G02F 1/00* | (2006.01) |
| *H04M 1/04* | (2006.01) |
| *A45C 11/00* | (2006.01) |
| *A45F 5/00* | (2006.01) |
| *G03B 11/04* | (2006.01) |
| *H04M 1/02* | (2006.01) |
| *H05K 9/00* | (2006.01) |

(52) U.S. Cl.
CPC .......... *H04M 1/0264* (2013.01); *H04N 5/225* (2013.01); *H05K 9/0045* (2013.01); *A45C 2011/002* (2013.01); *A45C 2011/003* (2013.01); *H02J 7/0021* (2013.01)

(58) Field of Classification Search
CPC ...... H04M 1/2064; H04M 1/18; H04M 1/185; H04N 5/2251; H04N 5/2254; H04N 5/2257; H04N 5/232; H04N 7/144; H04N 5/225; G03B 9/08; G03B 11/043; G03B 11/041; G02B 13/0075; G02B 13/007; G02F 1/137; G02F 1/153; H02J 7/0042; H02J 7/025; H02J 7/0003; H02J 7/0009; H02J 7/0021; H02J 7/0026; H02J 7/0027; H02J 7/0044; H02J 7/0045; G06F 1/1632; G06F 1/1656; G06F 1/1686; A45C 11/00; A45C 2011/002; A45C 2011/003; A45F 5/00; H01M 10/44; H04B 1/3888; H05K 9/0045; H05K 9/0047; H04R 1/08; H04R 3/00

USPC ................ 455/572, 573, 575.1, 575.3, 575.8
See application file for complete search history.

(56) References Cited

U.S. PATENT DOCUMENTS

| | | | |
|---|---|---|---|
| 9,179,195 B2 * | 11/2015 | Rao | H04N 5/44543 |
| 9,655,419 B2 * | 5/2017 | Nash | H05K 9/0045 |
| 2002/0030775 A1 * | 3/2002 | De Schipper | H04N 7/144 349/113 |
| 2009/0015192 A1 * | 1/2009 | Sheu | A45C 11/00 320/103 |
| 2013/0088639 A1 * | 4/2013 | Mundt | H04N 5/2251 348/372 |
| 2014/0333831 A1 * | 11/2014 | Oh | H04N 5/2254 348/376 |
| 2015/0229764 A1 * | 8/2015 | Shiga | H04M 3/48 705/7.19 |
| 2015/0236743 A1 * | 8/2015 | Kennedy | H04B 1/3888 455/575.8 |
| 2016/0352384 A1 * | 12/2016 | Ageishi | H04B 1/3888 |

FOREIGN PATENT DOCUMENTS

| | | |
|---|---|---|
| JP | 2005027142 A | 1/2005 |
| JP | 2005252854 A | 9/2005 |
| JP | 2008253112 A | 10/2008 |
| JP | 2014027731 A | 2/2014 |

\* cited by examiner

CRADLE WITH PRIVACY PROTECTION FUNCTION FOR PORTABLE ELECTRONIC DEVICE

This application is a national phase of International Application No. PCT/JP2015/072437 filed Jul. 31, 2015, which claims priority to Japanese Patent Application No. 2014-165114 filed Aug. 14, 2014 in the Japan Patent Office, which are hereby incorporated herein by reference.

TECHNICAL FIELD

The present invention relates to a cradle for portable electronic devices that can be used while protecting privacy.

BACKGROUND ART

Conventionally, as an accessory for portable electronic devices including smartphones or tablets, a cradle that enables data transfer to peripheral equipment such as personal computers (PC), or power feed only by mounting the portable electronic devices, has been in widespread use.

CITATION LIST

Patent Literature

Japanese Patent Application Laid-open No.2008-253112

Patent Literature

Japanese Patent Application Laid-open No. 2014-27731

THE SUMMARY OF INVENTION

Technical Problem

Recently, the leakage of information data, which corporates or individuals own and hold, caused by computer viruses, especially has been a serious problem in modern society in which the Internet forms major social infrastructure. There is the current reality that computer viruses which have targeted at personal computers of corporates or individuals as the object of information theft attack, are turning their fire on portable electronic devices including smartphones, which individuals or corporates own, having performance comparable to personal computers. Familiar portable electronic devices including smartphones are closely relating to life environment for corporates or individuals, and therefore prevention of information leakage from their electronic devices has become an urgent problem.

Solution to Problem

In order to resolve the above-described problem, a cradle with privacy protection function of the present invention is characterized in that a front extension line of a built-in front camera lens part of said portable electronic device during use of the cradle is shielded by an opaque or translucent lens shielding member provided on the front face side of the cradle. Further, the cradle with privacy protection function is characterized to have a clear colored cover member that allows the entire housing of said portable electronic device to be stored by aligning with a pedestal part of the cradle, and a member for blocking a hole for the built-in microphone in said portable electronic device during use of the cradle.

Advantageous Effects of Invention

By providing an opaque or translucent lens shielding member on the front of an extension line of the built-in front camera lens part of said portable electronic device during use of the cradle, photographing of front surrounding conditions of the cradle is disabled, even if unintended operation of the built-in front camera of the electronic device is performed by computer viruses or the like, and as a result, it becomes possible to prevent outflow of privacy information. Further, by providing a clear colored cover member that aligns with the pedestal part of the cradle, a box shape is formed, and said portable electronic device is stored at its inside, thereby enabling a risk of outflow of ambient voice information of the cradle to be reduced, even if an unintended operation of the built-in microphone in the electronic device is performed by computer viruses or the like. Furthermore, because a member for blocking a hole for the built-in microphone in said portable electronic device is provided, it becomes possible to further reduce a risk of outflow of ambient voice information, during use of the cradle.

DESCRIPTION OF EMBODIMENTS

EXAMPLES

Example

Figure 1:
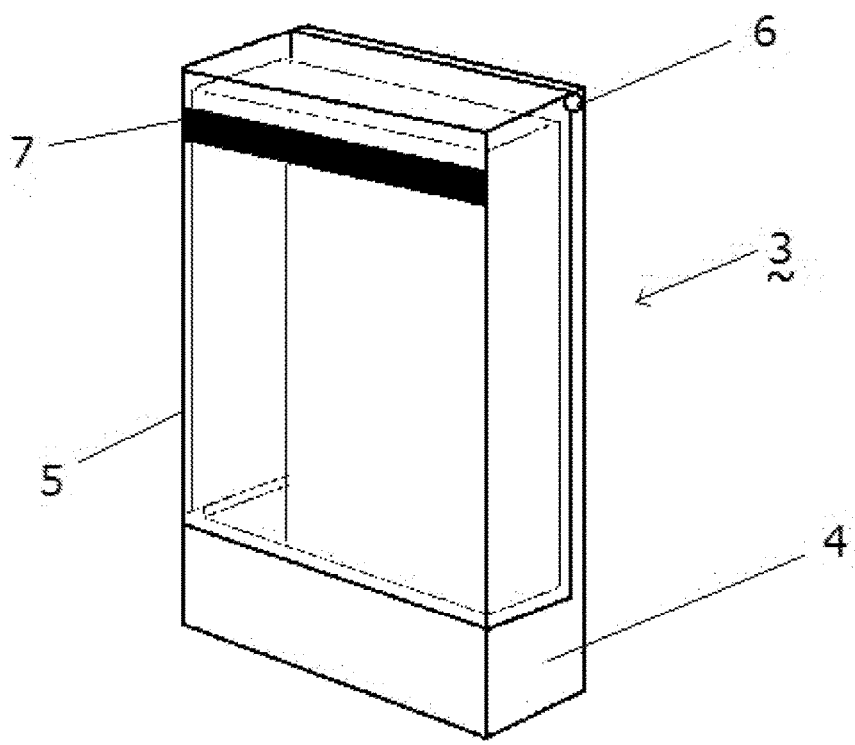
FIG. 1 is a perspective view of a cradle with privacy protection function for portable electronic devices of the present invention.
Figure 2:
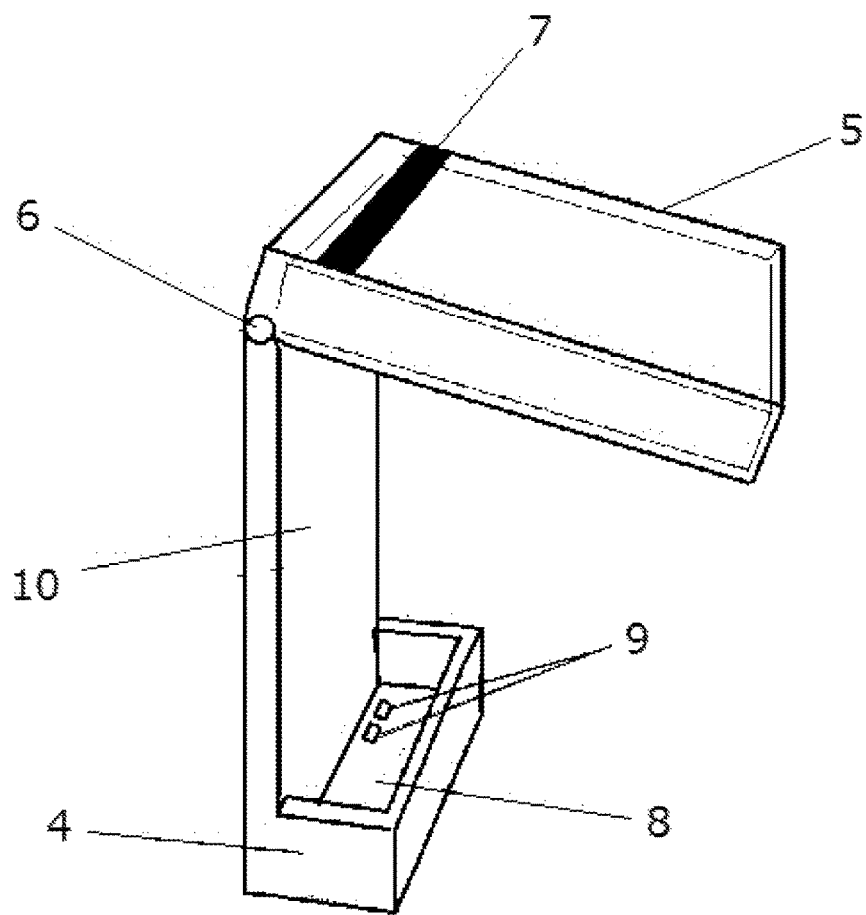
FIG. 2 is a perspective view when a clear color cover member of the above-described cradle is opened.
Figure 3:
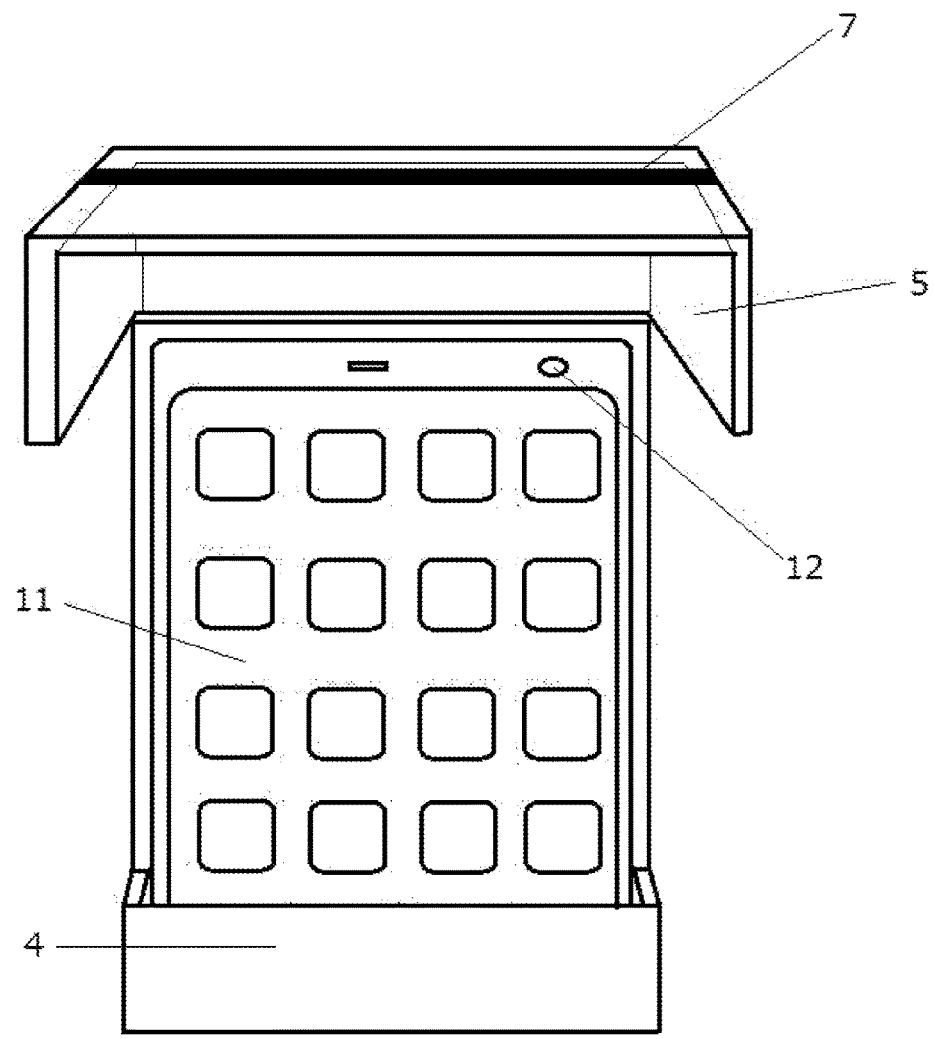
FIG. 3 is a front view in a state in which a portable electronic device is mounted, when the clear color cover member of the above cradle is opened.
Figure 4:
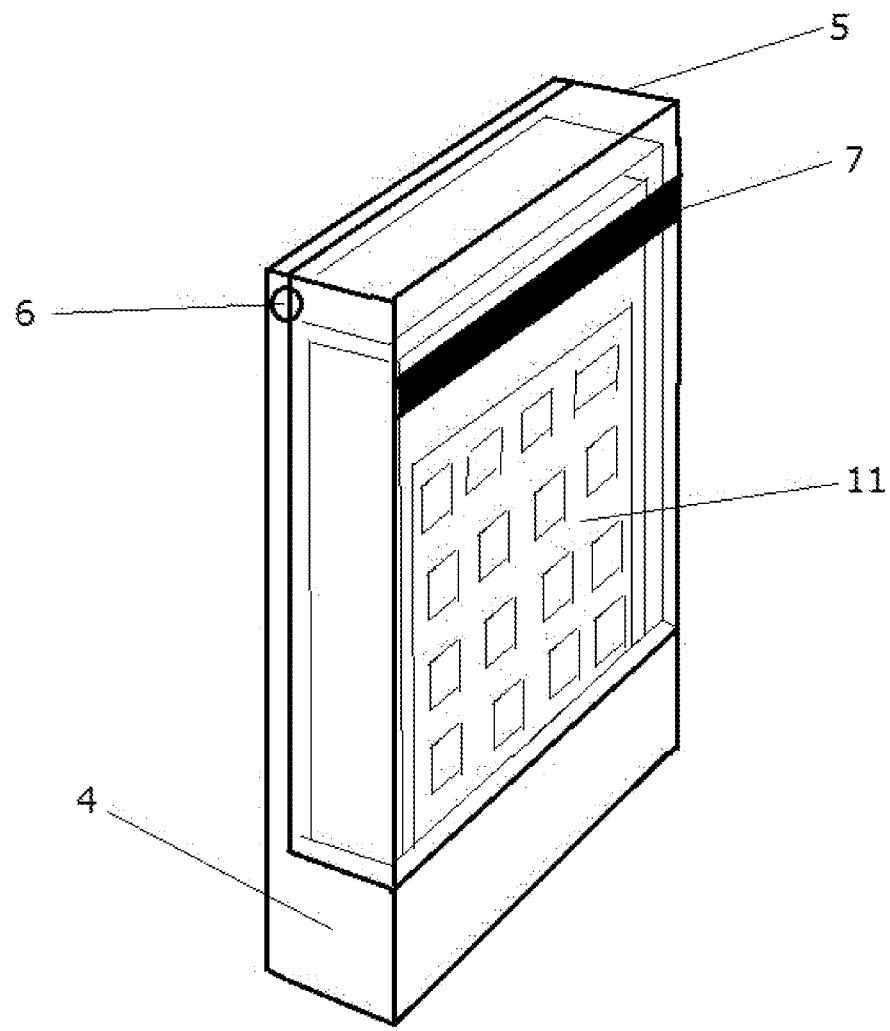
FIG. 4 is a perspective view when the portable electronic device of the above cradle is stored.

FIGS. 1 to 4 are each overall views of a cradle 3 with privacy protection function for portable electronic devices of the present invention, and a main configuration of a housing thereof includes a charging stand 4 having a pedestal part 8 for mounting thereon an electronic device 11 during use of the cradle 3, and a clear colored cover member 5, for forming a box shape capable of storing the electronic device 11 in alignment with the charging stand 4.

The clear colored cover member 5, as a means for solving problems in the present invention, is configured so that a front face part of a front camera lens 12 of the electronic device 11 is shielded by an opaque or translucent lens shielding member 7 provided thereon, during use of the cradle 3 for electronic devices, thereby disabling photographing of front surrounding conditions of the cradle 3, even if unintended operation of the built-in front camera in the electronic device is performed, thereby enabling prevention of outflow of privacy information.

In regard to the shape of the charging stand 4, as illustrated in FIG. 1 to FIG. 4, an idea of constituting a charging stand rear supporting surface 10 having a height that is greater than that of the electronic device 11 when mounted thereon, or constituting only the pedestal part 8 is conceivable.

In regard to the clear colored cover member 5, as illustrated in FIG. 1 to FIG. 4, a configuration for providing a hinge part 6 on the charging stand rear supporting surface 10 of the charging stand 4 so as to establish connection with the cover member 5, or an idea of only mounting the clear colored cover member 5 having a channel-shaped cross-sectional shape that covers a front face part and a back face part of the electronic device 11 on the pedestal part 8, in the case where the shape of the charging stand 4 is formed of only the pedestal part 8, is conceivable.

In regard to an attaching location of the lens shielding member 7, as illustrated in FIG. 1 to FIG. 4, in the case where the shape of the charging stand 4 is formed of only the pedestal part 8, not only on a front face side of the cradle 3 while the electronic device 11 is mounted, but the opaque or translucent lens shielding members 7 are provided respectively on the front face side and the back face side of the clear colored cover member 5 to be mounted on the pedestal part 8.

Figure 5:
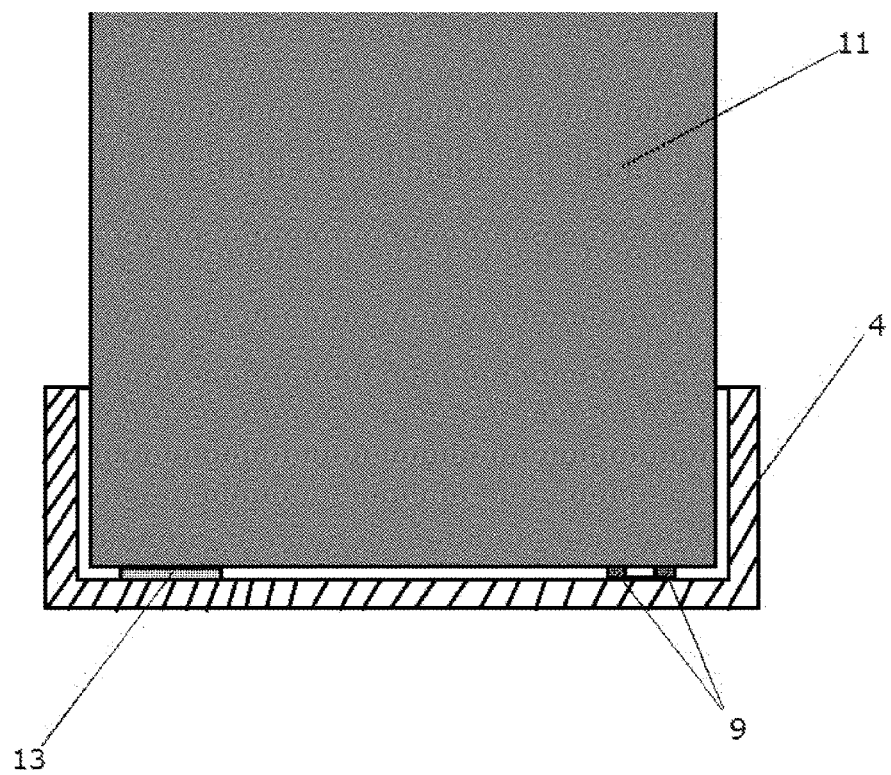
FIG. 5 is a cross-sectional view when the portable electronic device of the above cradle is mounted.

In regard to an attaching location of a microphone hole shielding member 13, as illustrated in FIG. 5, a built-in microphone hole in the electronic device 11 is shielded, by providing the microphone hole shielding member 13 at a space between the charging stand 4 when the electronic device 11 is mounted and a housing of the electronic device 11 mounted thereon, and therefore a risk of information outflow of ambient voices of the cradle 3 can be reduced even if unintended operation of a built-in microphone in the electronic device is performed.

In regard to material of the microphone hole shielding member 13, an idea of using not only hard member but also such a soft material that allows the microphone hole shielding member 13 to get into an internal space of the built-in microphone hole of the electronic device 11 is conceivable.

INDUSTRIAL APPLICABILITY

The present invention can be applied as a cradle device that is used when portable information terminals such as smart phones or tablets are charged.

REFERENCE SIGNS LIST

3 cradle with privacy protection function for portable electronic devices
4 charging stand
5 clear colored cover member
6 hinge part
7 camera lens shielding member
8 charging stand pedestal part
9 power feed terminal
10 charging stand rear supporting surface
11 portable electronic device
12 built-in front camera lens in portable electronic device
13 microphone hole shielding member

The invention claimed is:

1. A charging cradle for providing privacy protection to a portable electronic device, comprising:
    a pedestal part for mounting thereon the portable electronic device;
    a clear colored covered member when aligned with the pedestal part is configured to form a box shape to store therein an entire housing of the portable electronic device and to reduce the outflow of ambient voice information;
    an opaque or translucent lens shielding member provided on a front face side of the clear colored covered member and configured to shield a front face part of a built-in front camera lens part of the portable electronic device when the portable electronic device is mounted to the pedestal part during use of the charging cradle; and
    a microphone hole shielding member for blocking a hole for a built-in microphone of the portable electronic device when the portable electronic device is mounted to the pedestal part during use of the charging cradle.

2. The charging cradle according to claim 1, wherein the microphone hole shielding member is provided at a space between the pedestal part and the portable electronic device when the housing of the portable electronic device is mounted thereon.

3. The charging cradle according to claim 1, wherein the microphone hole shielding member is attached to a bottom surface inside the pedestal part of the cradle.

4. The charging cradle according to claim 1, wherein the microphone hole shielding member includes a soft material that allows the microphone hole shielding member to get into an internal space of the built-in microphone hole of the electronic device.

* * * * *